United States Patent [19]

Lee et al.

[11] Patent Number: 6,130,633

[45] Date of Patent: *Oct. 10, 2000

[54] MULTIBIT DIGITAL TO ANALOG CONVERTER WITH FEEDBACK ACROSS THE DISCRETE TIME/CONTINUOUS TIME INTERFACE

[75] Inventors: Wai Laing Lee; Axel Thomsen; Lei Wang; Dan Kasha, all of Austin, Tex.

[73] Assignee: Cirrus Logic, Inc., Austin, Tex.

[ * ] Notice: This patent is subject to a terminal disclaimer.

[21] Appl. No.: 09/089,489

[22] Filed: Jun. 2, 1998

[51] Int. Cl.[7] ........................................ H03M 1/66
[52] U.S. Cl. .............................................. 341/143
[58] Field of Search .................... 341/143, 144, 341/155

[56] References Cited

U.S. PATENT DOCUMENTS 5,376,936  12/1994  Kerth et al. .
5,412,348   5/1995  Kasha et al. .
5,541,599   7/1996  Kasha et al. .
5,644,257   7/1997  Kerth et al. .

*Primary Examiner*—Brian Young
*Attorney, Agent, or Firm*—J. P. Violette; David L. Stewart; Peter Rutkowski

[57] ABSTRACT

A multi-bit digital to analog converter uses both discrete time and continuous time processing to produce an analog output signal. The analog output signal is sampled and fed back across the discrete time/continuous time interface to the input of the conversion circuit. In one implementation, the discrete time processing uses an integrator chain of switched capacitor integrators and a switched capacitor low pass filter. The continuous time processor is a 2 pole low pass filter. A finite impulse response filter can precede the discrete time processing. A plurality of analog output sampling arrangements can be selectively applied accommodate a variety of operational conditions.

24 Claims, 21 Drawing Sheets

MULTIBIT DIGITAL TO ANALOG CONVERTER WITH FEEDBACK ACROSS THE DISCRETE TIME/CONTINUOUS TIME INTERFACE

CROSS-REFERENCE TO RELATED APPLICATIONS

The invention disclosed herein is related to application Ser. No. 09/089,490, (Docket No. 0841-CS) (Attorney Docket No. 50246-021 (3171-010)) filed Jun. 2, 1998, by inventors Wai Laing Lee, Axel Thomsen, Lei Wang and Dan Kasha and entitled "A DIGITAL TO ANALOG CONVERTER HAVING IMPROVED NOISE AND LINEARITY PERFORMANCE."

The invention disclosed herein is related to application Ser. No. 09/089,488, (Docket No. 0842-CS) (Attorney Docket No. 50246-026 (3171-015)) filed Jun. 2, 1998, by inventors Wai Laing Lee, Axel Thomsen, Lei Wang and Dan Kasha and entitled "A ONE BIT DIGITAL TO ANALOG CONVERTER WITH FEEDBACK ACROSS THE DISCRETE TIME/CONTINUOUS TIME INTERFACE."

The invention disclosed herein is related to application Ser. No. 09/089,495, (Docket No. 0844-CS) (Attorney Docket No. 50246-028 (3171-017)) filed Jun. 2, 1998, by inventors Wai Laing Lee, Axel Thomsen, Lei Wang and Dan Kasha and entitled "A ONE BIT DIGITAL TO ANALOG CONVERTER WITH RELAXED FILTERING REQUIREMENTS."

The invention disclosed herein is related to application Ser. No. 09/089,495, (Docket No. 0845-CS) (Attorney Docket No. 50246-029 (3171-018)) filed Jun. 2, 1998, by inventors Wai Laing Lee, Axel Thomsen, Lei Wang and Dan Kasha and entitled "A DIGITAL TO ANALOG CONVERTER FOR CORRECTING FOR NON-LINEARITIES IN ANALOG DEVICES."

The invention disclosed herein is related to application Ser. No. 09/089,495, (Docket No. 0846-CS) (Attorney Docket No. 50246-030 (3171-019)) filed Jun. 2, 1998, by inventors Wai Laing Lee, Axel Thomsen, Lei Wang and Dan Kasha and entitled "A DIGITALLY DRIVEN ANALOG TEST SIGNAL GENERATOR."

BACKGROUND OF THE INVENTION

1. Field of the Invention

The invention relates to digital to analog converters, and more particularly, to multibit digital to analog converters with feedback across a discrete time/continuous time interface.

2. Description of Related Art

Digital to analog converters (DACs) are well known in the art and have a number of uses. In one such use, a DAC takes a plurality of digital values, representing consecutive samples of analog signal in digital form, and converts the sequential digital sample values into a corresponding analog signal. Typically, digital to analog converters have some form of filter which smooths out the transition between discrete sample values.

Integrators are also known in the art. Some integrators are passive, in that they are made up of only components such as resistors or capacitors. Other integrators are active, using an amplifier to transfer the signal to an integration element, usually a capacitor. For low distortion, low noise applications, an active integrator is best suited. With CMOS integrated circuits, the switched capacitor integrator, and more generally, the switched capacitor filter is a commonly used circuit. In a switched capacitor circuit, a voltage is sampled onto a capacitor in one phase, and the resulting charge is transferred in a second phase, resulting in a current flow. This switched capacitor "branch" behaves much like a resistor when viewed at a low frequency. Its advantage in CMOS integrated circuits include ease of manufacturing and ease of matching to other elements.

Systems for conducting seismic exploration are well known in the art. On land, a plurality of transducers are deployed over a region and configured to receive reflections of acoustic signals from different geophysical layers beneath the surface of the earth. Seismic sensors are connected over cables to signal conditioning, digitization and digital recording equipment. When utilizing a seismic system, a strong acoustic signal is generated by, for example, setting off an explosion or by utilizing an acoustic signal generator having a relatively high power output. Reflections of the acoustic signals from the geophysical layers are then received at the seismic sensors deployed over a given area and the signals recorded, typically, for later analysis.

One problem with seismic exploration is that it frequently occurs in remote areas. Once sensors are deployed over a large area and seismic data gathered, great expense would be incurred if data were corrupted by malfunctioning sensors or electronics and a seismic survey crew needed to return again to the site, set up equipment and re-gather the data.

Seismic exploration has exacting requirements for seismic sensors and for the electronics which processes the signals derived from seismic sensors. There is therefore a need for testing equipment to ensure that both the devices and the associated electronics are functioning properly. When driving analog devices with digitally generated waveforms, it is sometimes the case that the analog device has nonlinear characteristics which adversely affect the analog device's ability to track the signal being applied to it. In addition, there are generally problems with linearity and noise when dealing with digital to analog converters.

SUMMARY OF THE INVENTION

The invention is directed to improving performance of N bit digital to analog converters. The conversion includes discrete time filtering and continuous time filtering with feedback across the discrete time/continuous time boundary. The techniques permit analog output meeting very strict noise and linearity performance to be achieved even though using components meeting more relaxed specifications.

DETAILED DESCRIPTION OF THE INVENTION

Figure 1:
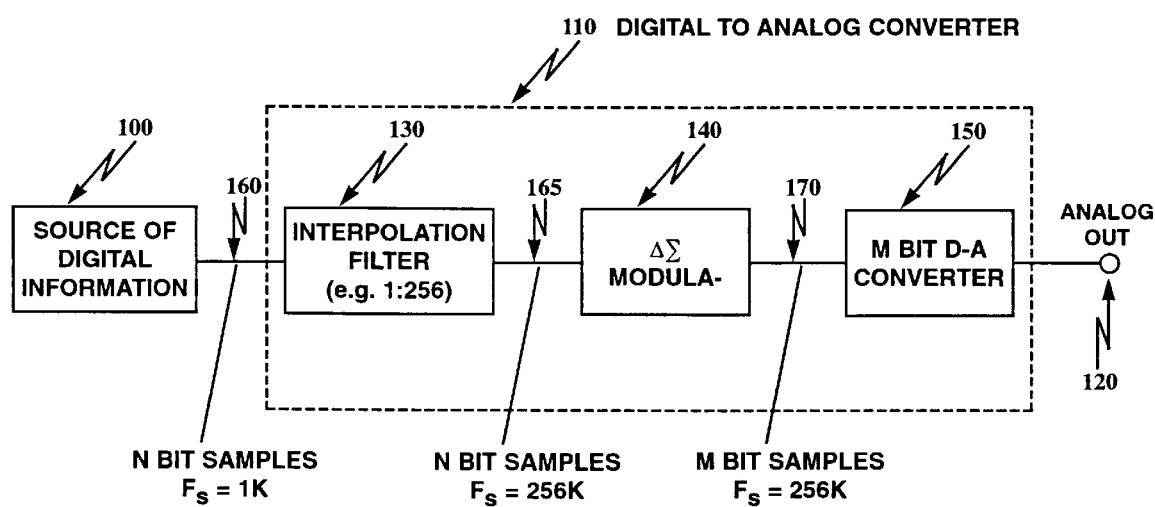
FIG. 1 is a block diagram of a digital to analog converter in accordance with the invention.

FIG. 1 is a block diagram of a digital to analog converter in accordance with the invention. An input 160 to the digital to analog converter 110 receives the output of a source of digital information 100. The source of digital information provides sample values as N-bit words at a low sample rate. Within the digital to analog converter 110, an interpolation filter 130 provides a plurality of samples of length N between each sample received on input 160. The N bit samples on line 165 are provided at a high bit rate and are received by a delta sigma modulator 140 where they are converted into M bit samples at the high bit rate, where M is significantly smaller than N. These M bit samples are received at the input to M bit D-A converter 150 where they are converted into an analog signal, as discussed more hereinafter, and applied to output 120 as an analog signal. The source of digital information 100 may be a computer generated waveform, a digital audio source such as that originating form a compact disc player, a digital audio tape or some other form of digital reproduction. In an exemplary implementation, N=24, M=1, the low sampling frequency is 1 kHz and the high sampling frequency is 256 kHz. 24 bit words arrive with a sample rate of 1 ksps (kilosamples per second) and are interpolated to 256 ksps maintaining 24 bits precision. In the digital delta sigma modulator they are converted to 1 bit words at 256 ksps and are converted by a one bit converter to the analog domain.

Figure 2A:
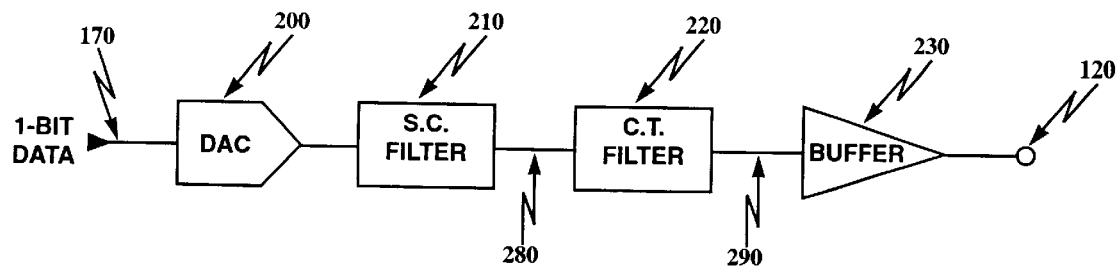
FIG. 2A is a block diagram of an architecture for a one bit digital to analog converter of a type found in the prior art.

FIG. 2A illustrates an architecture for a one bit DAC of a type found in the prior art. One bit input data is applied at input terminal 170 and is converted in a switched capacitor DAC 200 followed by a switched capacitor filter 210, a continuous time filter 220 and a buffer 230. The switched capacitor filter 210 performs low pass filtering for removal of quantization noise. The continuous time filter 210 performs low pass filtering for removal of quantization noise and removal of high frequency images of the signal. The buffer allows the DAC to drive a low impedance load at the analog output 120. All components shown in this arrangement contribute unattenuated noise and distortion that is added to the signal. To achieve 120 dB SNR and THD performance, each of the components shown will have to have better than 120 SNR and THD. It is also desirable to minimize the number of external components used. Noise requirements and low frequency operation may make it very difficult to integrate all filter capacitors. One fundamental distortion source is the fact that the waveform at the output of the last discrete time switched capacitor stage 280 is seen in continuous time by the following stage. All glitches, differences in rise times vs. fall times, signal dependent settling waveforms etc., are contributors to distortion, even if the switched capacitor circuit settles to the correct final value. To overcome the deficiencies of the prior art and to achieve the desired design objectives of low distortion, low noise, low power, few external components, and acceptable out-of-band quantization noise, the architecture of FIG. 2B is employed.

Figure 2B:
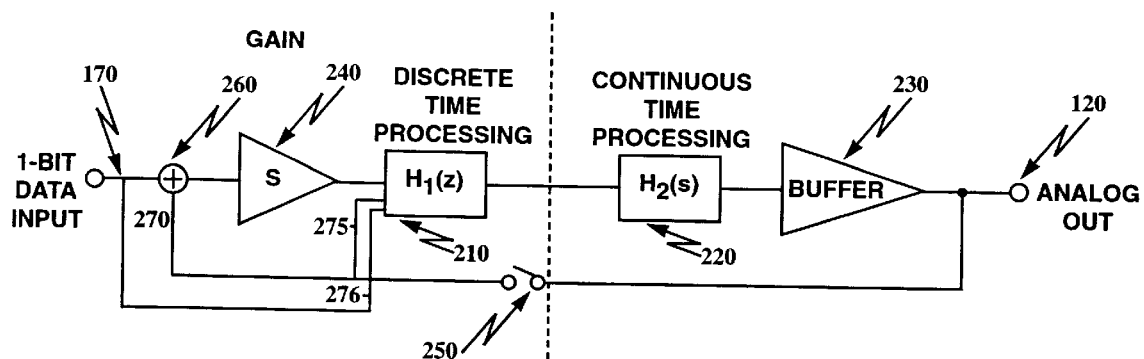
FIG. 2B is a block diagram of an architecture of a one bit digital to analog converter corresponding to the M bit D-A converter shown in FIG. 1.

FIG. 2B illustrates a conceptual view of a 1-bit DAC 150 of FIG. 1 in accordance with the invention. One bit input data is applied at input terminal 170 and converted to an analog quantity 120. From this a sample of the output voltage is subtracted via line 270 to summer 260 and the difference is integrated in a switched capacitor integrator 240. This is followed by a switched capacitor filter 210, a continuous time filter 220 and a buffer 230. The switched capacitor filter 210 performs low pass filtering for removal of quantization noise and is also used to increase the low frequency loop gain. It receives input from integrator 240 but may also receive sampled output values via line 275 or converted input data via line 276 to perform its signal processing function. The continuous time filter 210 performs low pass filtering for removal of high frequency images of the signal. The buffer allows the DAC to drive a low impedance load at the analog output 120. The output 120 is sampled by exemplary switch 250 to be applied to the summer 260. The dashed vertical line shown in FIG. 2B represents the discrete time/continuous time interface. Signals to the left of the line are discrete time signals, meaning that their value is only valid at a plurality of sequential time instances. Signals to the right of this line are continuous analog signals. In this invention this interface is crossed in both directions. From the discrete time to the continuous time, the line is crossed in a manner similar to the prior art. Glitches and settling waveforms are present. From the continuous time to the discrete time it is crossed by the process of sampling. Accurate sampling is well understood in the art of the design of analog to digital converters. The basic approach in accordance with this invention is to enclose all troublesome areas in a feedback loop that is closed by sampling of the analog output and feeding the output signal back to a summer at the input. This technique allows one to relax noise and distortion requirements for most stages and interfaces enclosed in the loop. The achievable accuracy is now determined solely by the noise and distortion of the first summer and integrator and the linearity of the resampling process of the output. Aliasing of high frequency components into the band of interest is an effect that has to be considered.

Three distortion sources will be considered here. First, the distortion of the continuous time circuitry, especially the buffer, will be considered. Since this circuitry is preceded by at least one integrator in the loop, its input referred distortion and noise contribution are reduced by the loop gain. For example, a buffer with 60 dB of THD preceded by 60 dB of gain will cause 120 dB THD.

Second, the distortion of the switched capacitor circuits will be considered. The spectrum of a distorted switched capacitor circuit includes not only harmonics in the band, but due to the discrete time nature of the signal, smaller harmonics around multiples of the sampling frequency n*Fs. The in band harmonics are reduced when preceded by loop gain. The images of the harmonics near n*Fs could get aliased into the baseband by sampling and need to be removed by antialias filtering. In a highly oversampled system, that is a system with a large ratio of Fs/2 over the maximum signal frequency (oversampling ratio) these components are generally attenuated by the sample and hold function embedded in the switched capacitor circuit, which eases the antialias filter constraints. For example, a −60 dB distortion in band, with 100× oversampling ratio, will have an image near Fs that is at −100 dB. In this case 60 dB of loop gain and 20 dB of antialias filtering is needed to achieve 120 dB linearity.

Third, the glitches and settling waveforms at the interface between discrete time and continuous time will be considered. The signal of interest is the difference between the ideal stairstep of a discrete time signal after a sample and hold function and the real waveform. This signal can be modeled as a sequence of impulses at a rate of Fs amplitude modulated by the signal in a nonlinear manner. Its spectrum has a signal component in the band and similar sized images near n*Fs. Accordingly, if there is a distortion component in the band, it has a similar sized image near Fs, 2*Fs etc. The in-band distortion components will be attenuated once again by loop gain. The images must be removed by antialias filtering before the resampling process to maintain good performance. For example, an 80 dB linear settling waveform will have an image of 80 dB near Fs. To achieve 120 dB performance, 40 dB of loop gain and 40 dB of antialias filtering are required to achieve 120 dB linearity.

Figure 3:
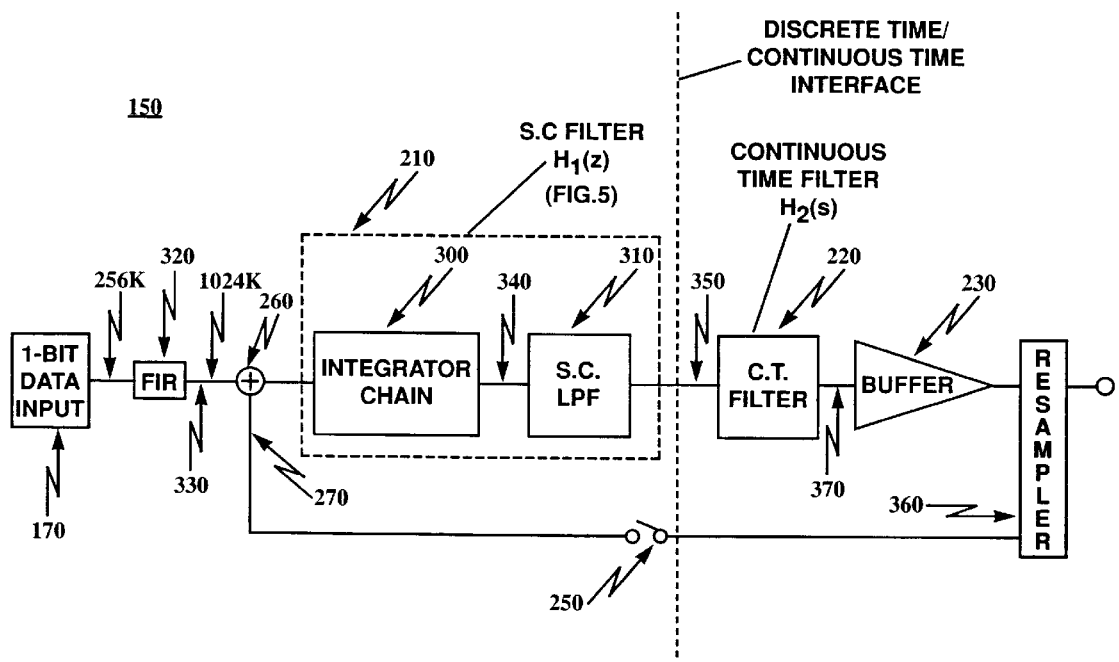
FIG. 3 is a block diagram of the one bit digital to analog converter described in FIG. 2.

FIG. 3 is a block diagram of the one bit D-A converter described in FIG. 2B in accordance with one embodiment of the invention. One bit digital data at a certain bit rate is input to an FIR filter 320 to interpolate the data to the input sampling rate and reduce the out-of-band quantization noise. It will be discussed in more detail hereinafter in conjunction with FIG. 4. The FIR filter is not necessary for the function of the loop shown in FIG. 2B, but provides a way to improve the performance of the overall system. The output of the FIR filter 330 is applied to summer 260 which also receives the sampled output via line 270. The output of the summer goes to discrete time processing 210 which comprises an integrator chain 300 and a low pass filter 310. Both of these are switched capacitor implementations. The output of the discrete time processing 210 is applied over line 350 to the continuous time processing 220 across the discrete time/continuous time interface shown by the vertical dashed line. The output of the continuous time filter 220 is applied to buffer 230 before passing to the analog output. The output of buffer 230 is conditioned for resampling in resampler 360 and fed back across the discrete time/continuous time interface by sampling with switch 250. The sampled output is fed back to one input of the summer 260. The resampling network is discussed hereinafter in conjunction with FIG. 11.

Figure 4A:
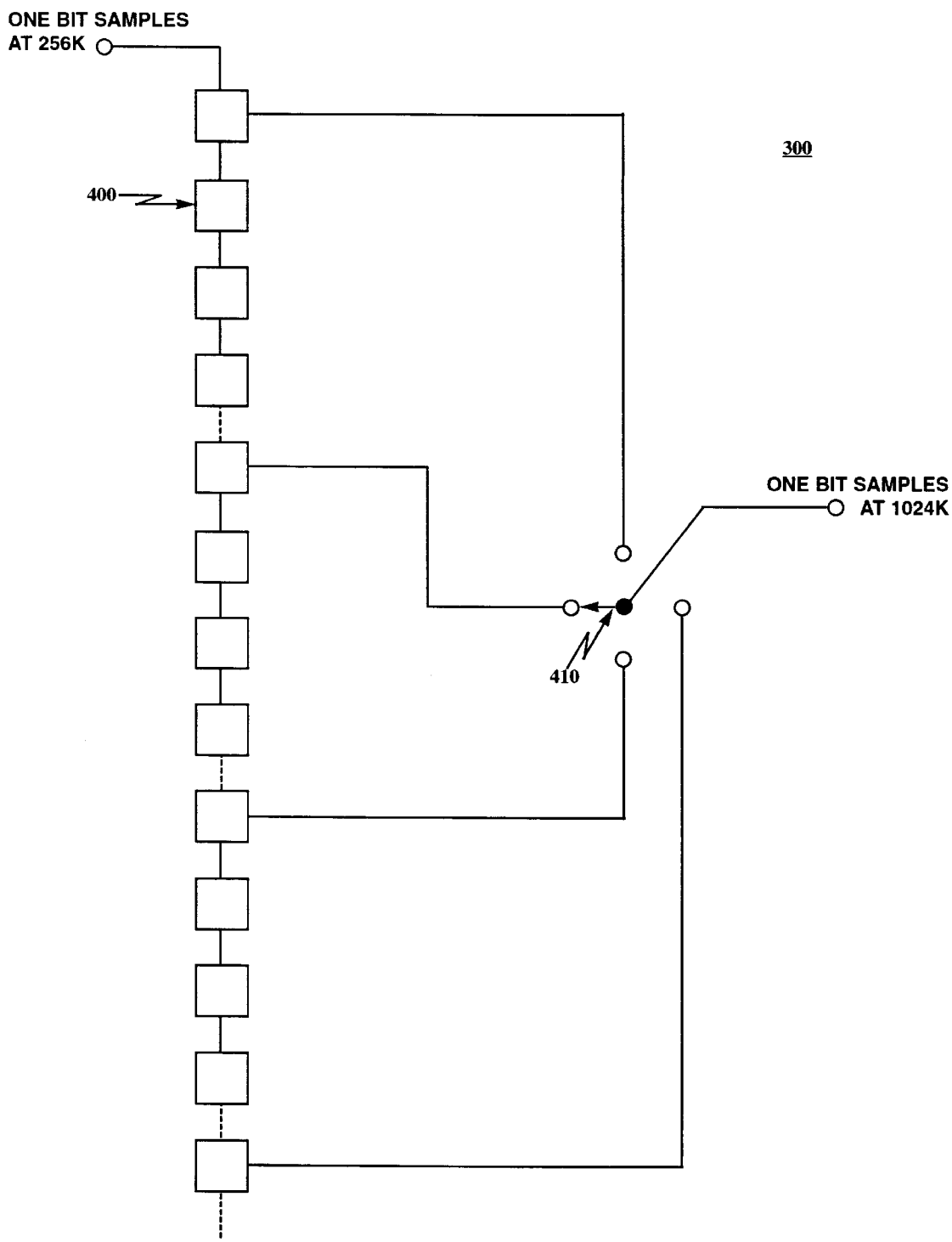
FIG. 4A is a block diagram of an exemplary implementation of a finite impulse response (FIR) filter shown in FIG. 3.

FIG. 4A is a block diagram of an exemplary implementation of the finite impulse response filter shown in FIG. 3. A plurality of one bit samples are received at $F_{in}$=256 ksps. These one bit samples are passed sequentially into a shift register that shifts samples from element 400 to the next element 400 at the frequency $F_{in}$. In one exemplary form the FIR filter 300 has a plurality of taps at different cell intervals along the shift register. These taps are applied to terminals on selector 410 which sequentially samples the samples stored in a cell such that four taps are sampled in every clock instant of $F_{in}$. This results in one bit outputs at a clock rate of Fs=1024 ksps at the output of the FIR filter. The sampling rate Fs and the input data rate $F_{in}$ are typically identical in a single bit digital to analog converter. If system level constraints and circuit level constraints affect these rates, the sampling rate may be significantly higher than the data rate. In this practical case, the sampling rate of 1024 kHz was used for synchronicity with other precision sampling processes on the same integrated circuit. The data rate was limited to 256 kHz due to communication channel limitations. This difference in rates gives the opportunity to implement a time multiplexed analog FIR filter with filter coefficients of plus or minus one, without adding any analog hardware. Using 16 delay elements between taps, the filter implements the function d0+d16+d32+d48. By summing a plurality of binary values one achieves a multi-level signal that is analog in nature. It is realized using 48 digital delay elements to form the shift register and a multiplexer to implement the selector 410. In an alternative implementation, a nonmultiplexed analog FIR could be implemented using a switched capacitor adder in place of selector 410.

Figure 4B:
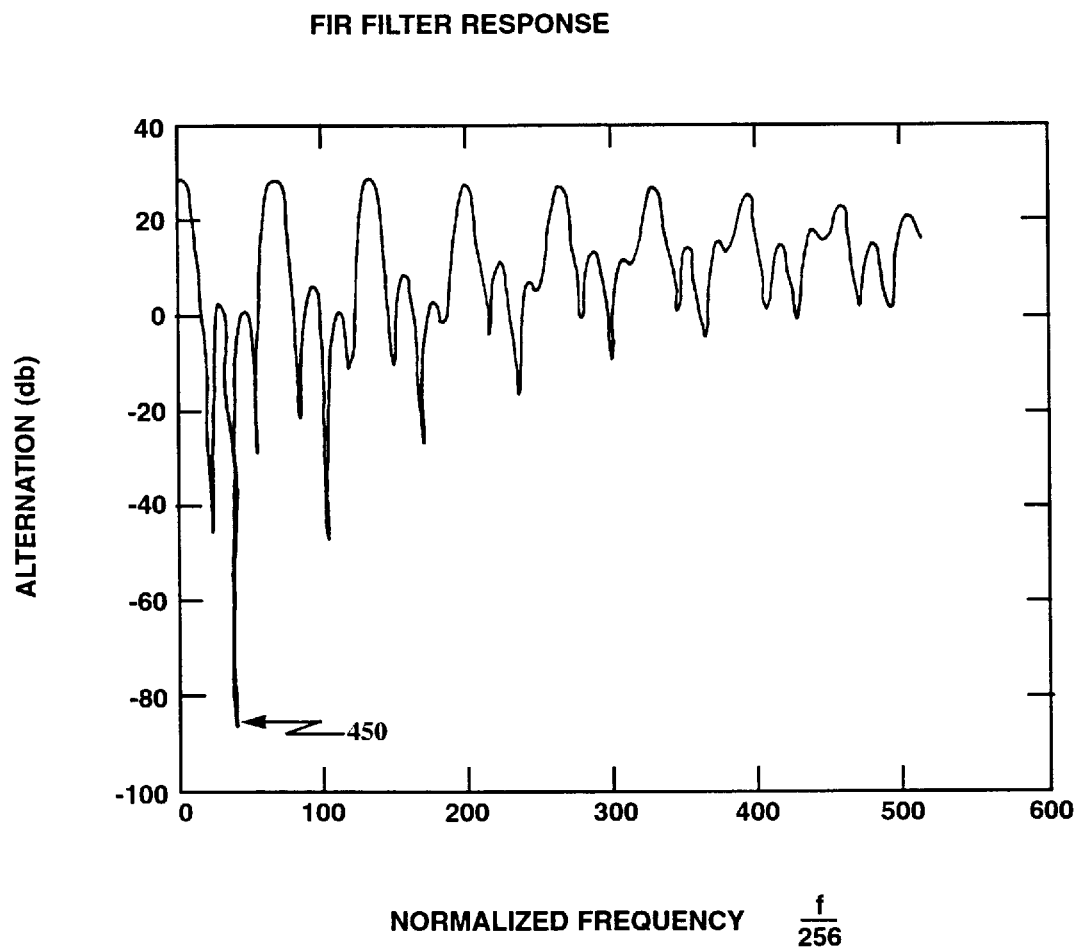
FIG. 4B is a graph of the FIR filter response as a function of frequency in an exemplary embodiment.

FIG. 4B shows the frequency response of the exemplary FIR filter. It is most efficient if an area of strong attenuation 450 is placed at the frequency that would otherwise be the peak of the out of band quantization noise. The optimum number of delay elements and tap positions can be derived from numerical simulations. In the exemplary implementation it allowed a reduction of out of band quantization noise of 12 dB.

Figure 5A:
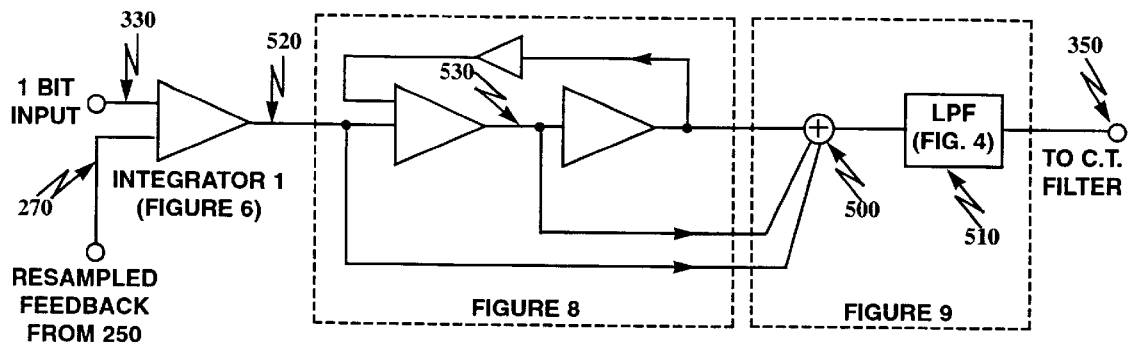
FIG. 5A is a block diagram of an exemplary implementation of the switched capacitor filter section of the D-A converter shown in FIG. 3.

FIG. 5A is a block diagram of an exemplary implementation of the switched capacitor filter section of the D-A converter shown in FIG. 3. It consists of the low pass quantization noise filter 510 preceded by a chain of integrators. The one bit input is received at input 330 to integrator 1. Integrator 1 is shown in more detail hereinafter in conjunction with FIG. 6. The sampled output is applied over a second input 270 to integrator 1. The output of integrator 1 at 520 is applied to integrator 2 and its output at 530 is applied to integrator 3. The output of integrator 3 can be fed back to the input of integrator 2 to form a resonator. A resonator can greatly increase the loop gain around one specific frequency. The purpose of this cascading of integrators and creation of resonators is the creation of large low frequency loop gain. The number of integrators used is dependent on the design goals and can be any number. Equivalent loop gain can also be created by using multiple nested feedback loops as long as the noise from the output of the switched capacitor stage is highly attenuated when referred to the input. Similarly the choice of quantization filter order, pole location and architecture is dependent on specifications. Many architectures and combinations of the two tasks of loop gain and filtering are possible. The requirement is low pass filtering of signals coming from the input. The outputs of all integrators are summed in summer 500 and applied to the low pass filter. These connections provide feed-forward compensation of the multistage integrators. They are necessary to ensure stability of the feedback loop together with the proper choice of integrator bandwidth. In the exemplary implementation the bandwidth of the integrators are f1=2200 Hz, f2=1010 Hz and F3=700 Hz. The resonator is located at 160 Hz. The 3 dB frequency of the low pass filter is 5900 Hz. These parameters allow greater than 60 dB of gain for frequencies below 200 Hz, and quantization noise attenuation to −54 dBfs in conjunction with the quantization noise removal by the FIR filter.

Figure 5B:
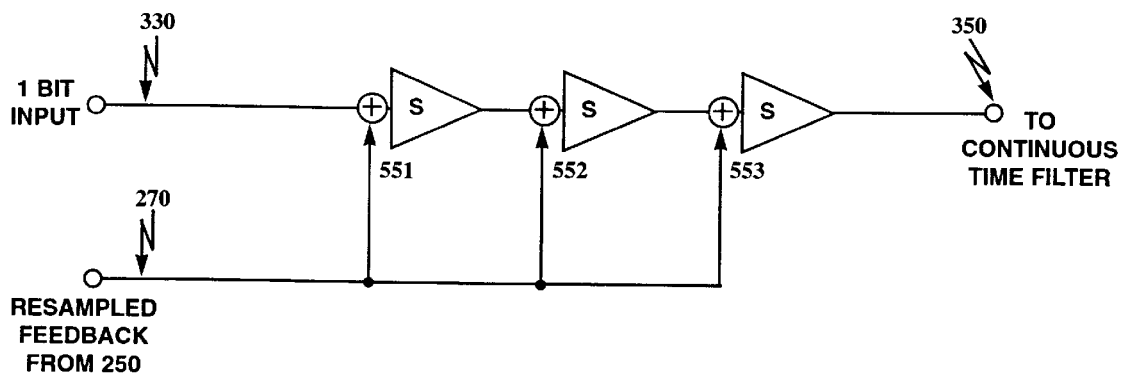
FIG. 5B shows an exemplary implementation of an alternative integrator with multiple connections to the feedback signal.

FIG. 5B shows an exemplary implementation of an alternative integrator arrangement with multiple connections to the feedback signal which could achieve similar performance. The multiple nested feedback loops 551, 552, 553 of this alternative architecture perform essentially the same task as the stages shown in FIG. 5A. The cascade of integrators achieves loop gain that precedes the discrete time to continuous time interface. It also provides low pass filtering for quantization noise removal for the input signal. As a tradeoff, there are more difficult challenges in achieving low distortion in the resampling and the integrator 1 amplifier. The output of integrator 1 now contains a large scale signal. The resampling signal has to be applied to three different summers.

Figure 5C:
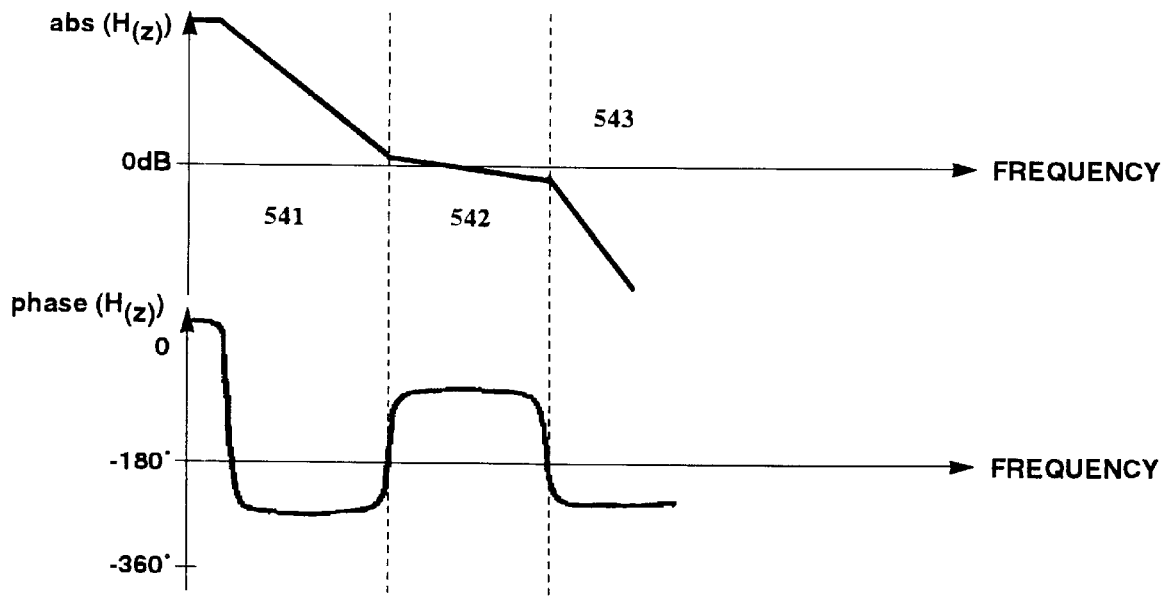
FIG. 5C shows a Bode plot of the switched capacitor system of FIG. 5A without a resonator.

FIG. 5C shows a Bode plot of the switched capacitor system in FIG. 5A without resonator. This is the open loop transfer function. It has 3 distinct sections: Loop gain in the low frequency region 541 for suppression of back end distortion, single integrator behavior and less than 180 degrees of phase lag in the unity gain frequency region 542 for stability of the loop, and attenuation at higher frequencies 543 for quantization noise attenuation.

Figure 5D:
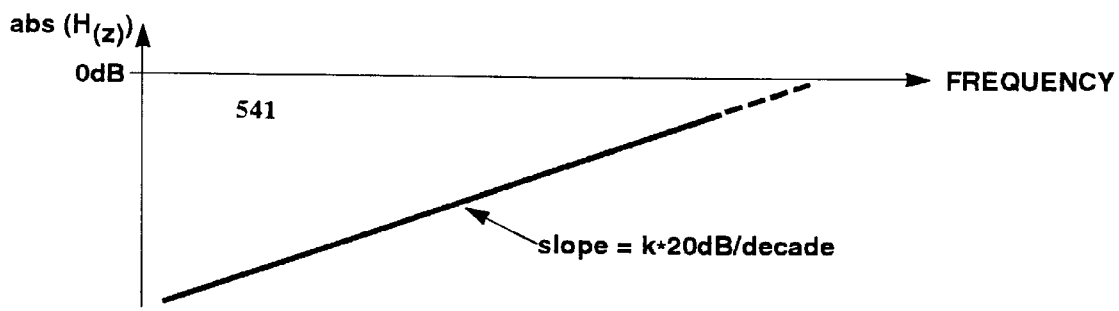
FIG. 5D shows a Bode plot of the amplitude of the transfer function by which a signal at the discrete time/continuous time interface is referred to the input.

FIG. 5D shows a Bode plot of the amplitude of the transfer function by which a signal at the discrete time/continuous time interface 350 is referred to the input 330. Strong attenuation in the signal band is required to achieve low distortion operation. With a cascade of k integrators, the input referred attenuation increases by k*20 dB/decade as frequency decreases. A resonator would add a zero at one frequency. The above diagrams show exemplary implementations but there are many possible ways to implement this transfer function.

Figure 5E:
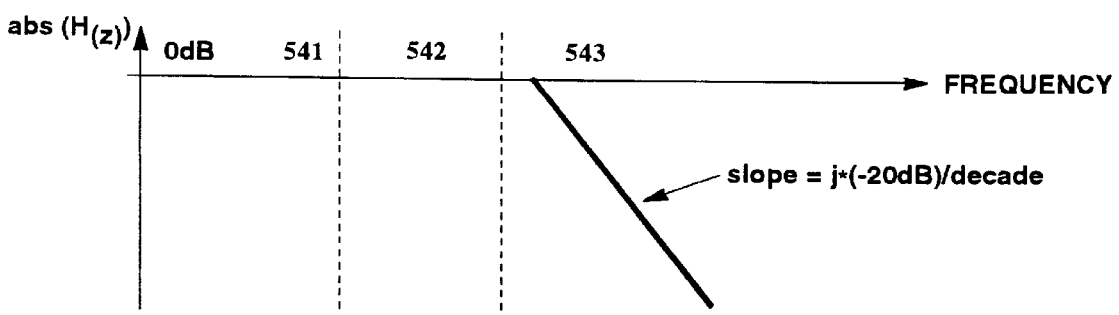
FIG. 5E is a Bode plot of the amplitude of the closed loop transfer function.

FIG. 5E shows the Bode plot of the amplitude of the closed loop transfer function from the input 330 to the output of the switched capacitor section 350 necessary for quantization noise filtering. Constant gain in the band of the signal and strong attenuation outside that band. The attenuation increases with j*20 dB/dec where j denotes the filter order as seen by the input. The above diagrams show exemplary implementations but there are many possible ways to implement this transfer function.

Figure 6A:
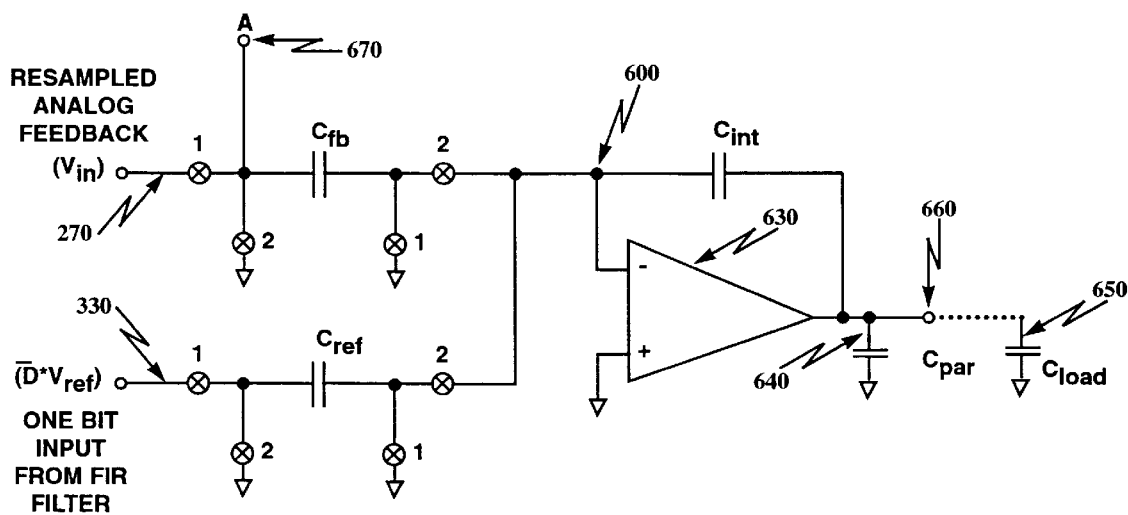
FIG. 6A is a simplified schematic diagram of integrator 1 shown in FIG. 5A.

FIG. 6A is a simplified schematic diagram of integrator 1 shown in FIG. 5. It is identical in architecture to the input stage of a delta sigma A-D converter. There are two inputs to this circuit. The first, input 330, receives the 1 bit input from the FIR filter 320. The other input 270 receives the sampled analog output 120. The logic value of the incoming 1 bit signal determines the polarity of charge applied to $C_{ref}$ to be added to the sampled analog feedback signal. The two inputs are combined using a switched capacitor input arrangement at the summing node 600 of amplifier 630. Input 330 uses capacitor $C_{ref}$ and input 270 uses capacitor $C_{fb}$. The switches in this and the following schematics are labeled 1 or 2 according to the clock phase during which they are closed. The operation, design and detailed implementation of this and all following simplified schematics of switched capacitor circuits is according to techniques well known in the art.

Figure 6B:
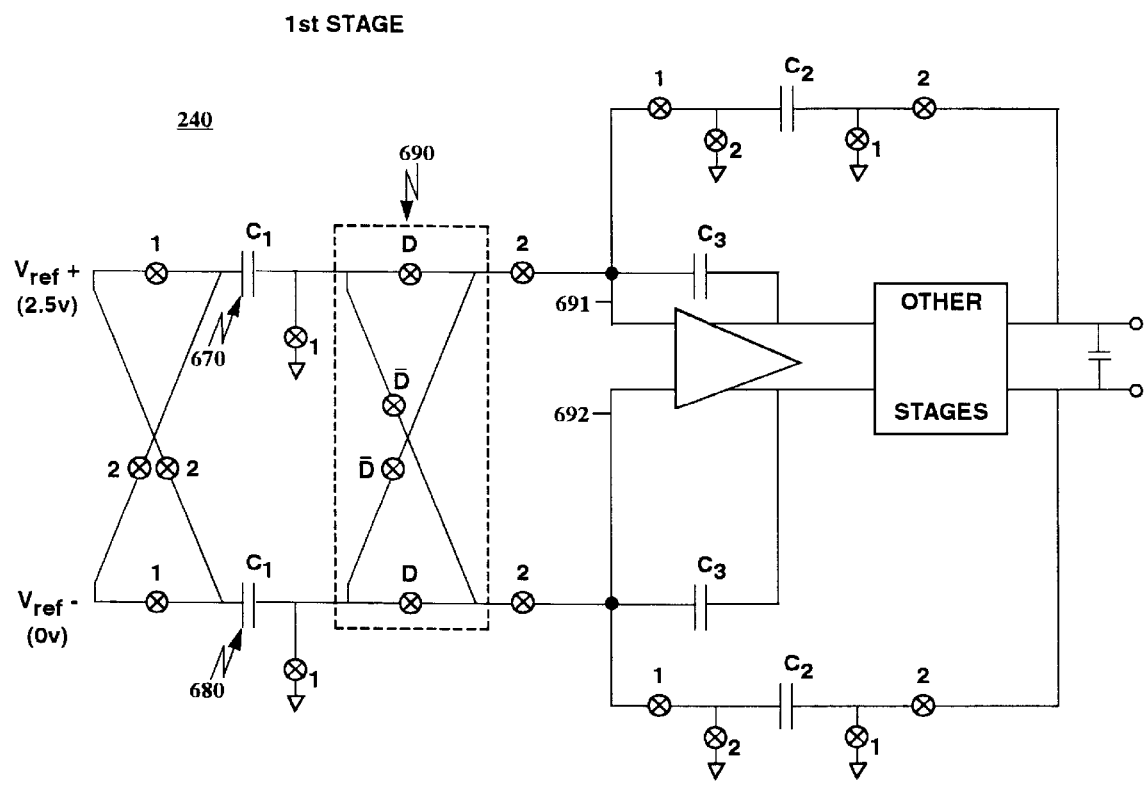
FIG. 6B is a schematic diagram of a fully differential equivalent of the amplifier shown in FIG. 6A.

FIG. 6B shows the fully differential equivalent of FIG. 6A with a more detailed illustration of the implementation of the multiplication of the data with the reference. In the example shown, two reference voltages $V_{ref+}$ and $V_{ref-}$ are utilized. Both are sampled in a cross-coupled manner onto capacitors 670 and 680. Capacitor 670 transfers a charge of $C1*(V_{ref+}-V_{ref-})$ to the summing node, capacitor 680 transfers a charge of $C1*(V_{ref-}-V_{ref+})$. The block 690 directs these charges according to the data in an inverted or noninverted manner to the op-amp summing nodes 691 and 692. Switches labeled D are closed for data D=1 and open for data D=0, switches labeled $\overline{D}$ are closed for data D=0 and open for data D=1. Integrator 1 as shown in FIG. 6B utilized a single bit word size at the input. It is also possible to adapt the architecture to accommodate multiple bit word inputs.

Figure 7:
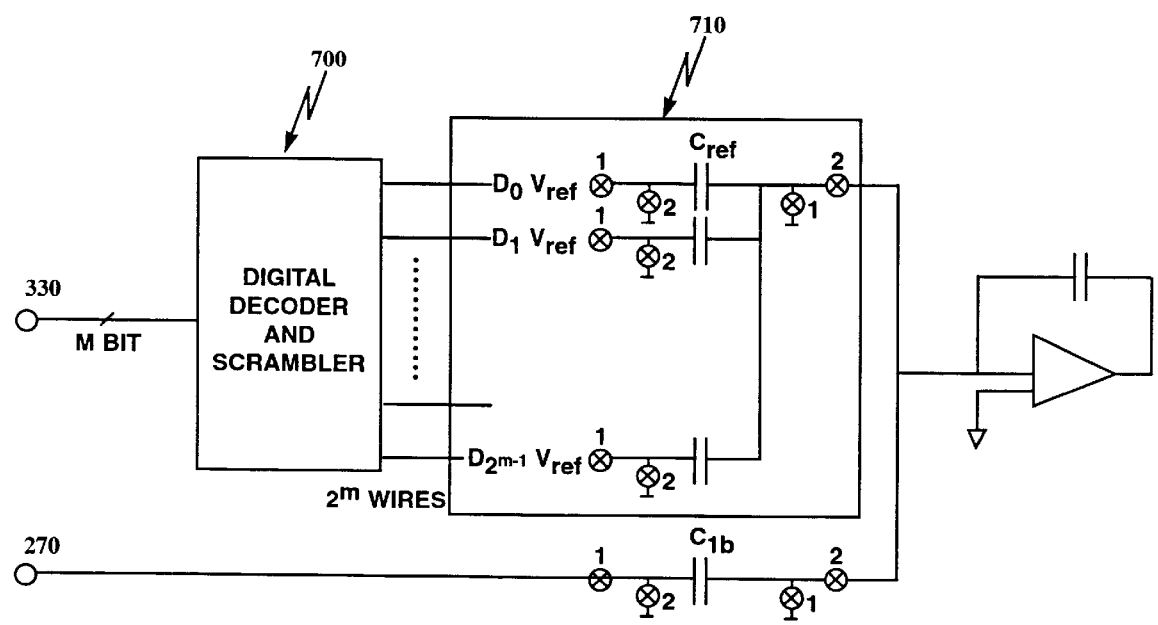
FIG. 7 is a schematic diagram of a multibit version of integrator 1 shown in FIG. 6A.

FIG. 7 is a schematic diagram of a multibit version of integrator 1 shown in FIG. 6A. Many techniques are known in the art to implement accurate multilevel converters in switched capacitor technology. FIG. 7 shows an exemplary implementation of such a converter. During every clock cycle a multibit word of length M is received by a digital decoder and scrambler, 700. The output of this decoder controls an array of $2^M$ switches and sampling capacitors 710. During each clock phase a charge representing $Q_{ref}*\Sigma^{M-1}_{0}(di*2)^i$ is summed to the resampled output and integrated in integrator 1. This arrangement has reduced quantization noise, but more difficult challenges to achieve high linearity. The implementation shown is only one of the many implementations known in the art. Any technique for high precision digital to discrete-time-analog conversion is applicable here.

Figure 8:
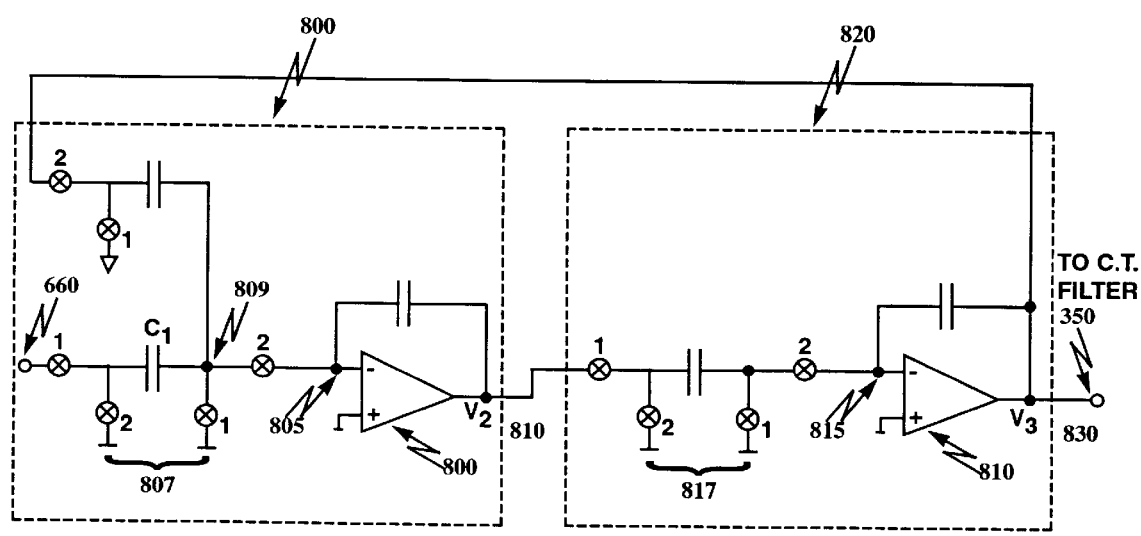
FIG. 8 is a schematic diagram of integrator 2 and integrator 3 of FIG. 5A.

FIG. 8 is a simplified schematic diagram of integrator 2 and integrator 3 of FIG. 5A. The output of integrator 1 which appears at input line 660 is integrated in the first switched capacitor (807) integrator stage 800 to produce output 810. The output 810 is integrated in another switched capacitor (817) integrator stage 820 to produce output 830. A resonator can be implemented by feeding output 830 to the input of integrator stage 800. The circuits are identical to those typically used in oversampled delta sigma A-D converter implementations. Several techniques for the parametrization of the integrators are known in the art and are applicable here. The procedure for finding integrator bandwidths for stability and gain requirements can be done by numerical optimization or by designing for a specific transfer function for a signal at the discrete time/continuous time interface 350 to the input 330.

Figure 9:
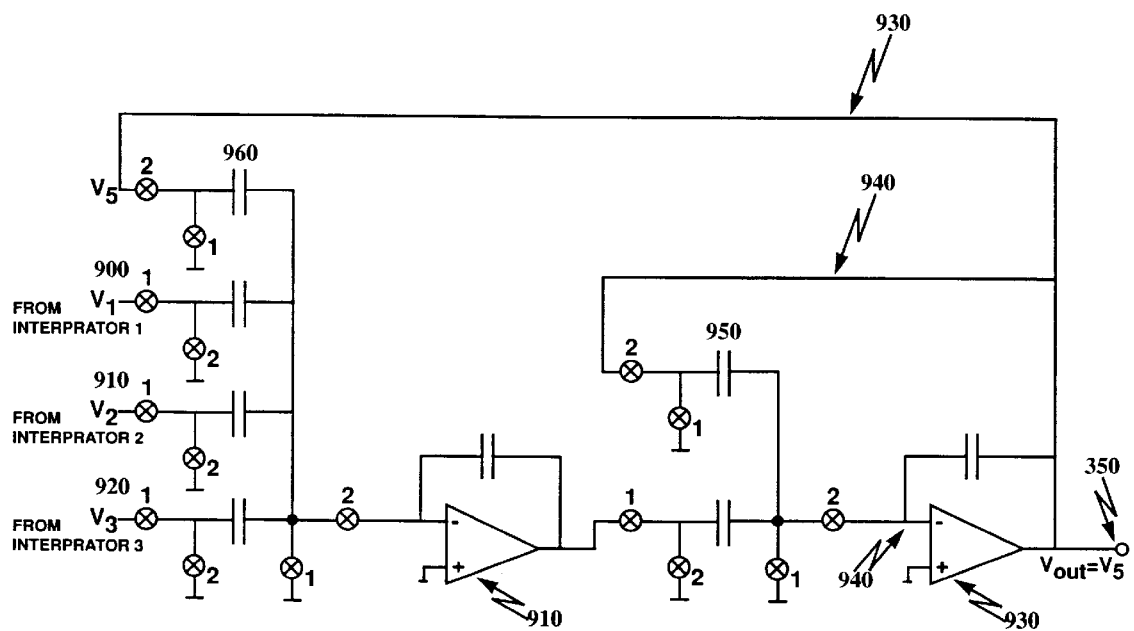
FIG. 9 is a schematic diagram of the summing circuit and low pass filter of FIG. 5A.

FIG. 9 is a simplified schematic diagram of the summer and low pass filter of FIG. 5. The summer has a plurality of switched capacitor inputs 900, 910, 920 receiving respectively the outputs of integrators 1, 2 and 3. It is necessary for the compensation of the multi-integrator feedback loop to provide feed forward paths from integrators 1 and 2. With the bandwidth of integrators 2 and 3 less than the bandwidth of integrator 1, those integrators are effectively bypassed by the feed forward path so that a single integrator remains in the loop at unity gain crossover, a condition that is necessary for the loop to be stable. The remaining circuitry implements a standard two pole filter. In this exemplary implementation, amplifier 930 is in the last switched capacitor filter stage. It has to settle the charge pulses coming into the summing node 940 and charge the feedback capacitors 950 and 960. Its output will be effectively integrated over a clock period by the subsequent continuous time filtering. Since amplifier 930 is at the discrete time/continuous time interface, it has settling waveforms that meet certain linearity requirements. In the exemplary implementation, this requirement is a THD of less than −80 dB.

Figure 10:
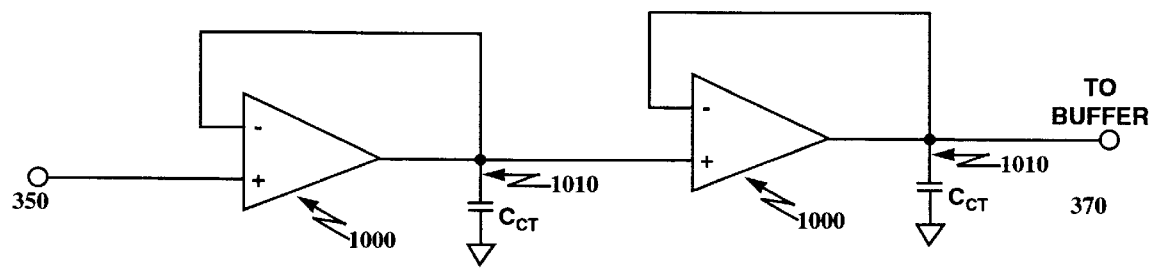
FIG. 10 is a schematic diagram of an exemplary implementation of a continuous time filter shown in FIG. 3.

FIG. 10 is an exemplary implementation of a continuous time low pass filter. The filter is implemented using an operational transconductance amplifier in buffer configuration 1000 with a capacitive load 1010. The capacitance limits the bandwidth of the amplifier to $gm/(2*pi*C_{load})$, where gm is the transconductance of the amplifier 1000. This configuration does not load the preceding amplifier and thus eases the design of that stage. This filter provides the attenuation determined from above calculations at the sampling frequency of the resampling of the output. The filter also has a small phase lag at the unity gain crossover frequency of the loop which is identical to the bandwidth of integrator 1 to allow the loop to remain stable. A multistage filter is used to meet the specifications. In the exemplary implementation a two stage filter with a nominal cutoff frequency of 30 kHz was used to meet specifications over all corners of temperature and parameter tolerances. The filters purpose is different from the switched capacitor low pass filter and the two are generally not interchangeable. In a general IC fabrication process the time constant of a continuous time filter is generally poorly controlled so that this filter could not perform adequate quantization noise filtering without the techniques of the invention. A switched capacitor filter on the other hand does not perform antialias filtering. Implementation alternatives for the continuous time filter include a differential transconductor into a capacitive load, MOSFET-C active filters, and active and passive RC filters. The design has very relaxed linearity and noise requirements because it is preceded by loop gain.

FIGS. 11A, 11B, 11C and 11D show several exemplary implementations of the output buffer and resampling circuitry.

Figure 11A:
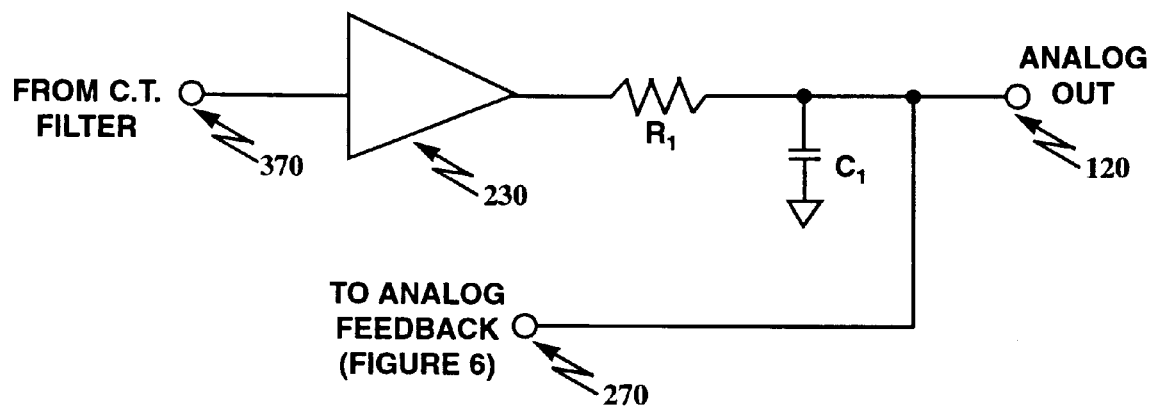
FIGS. 11A, 11B, 11C and 11D show alternative buffer and resample combinations illustrated in FIG. 3.

In FIG. 11A, the output from the continuous time filter in FIG. 3 is received over line 370 and provided to a buffer amplifier 230 which provides the output voltage levels needed for a particular design at the needed current levels. The resistor-capacitor combination R1C1 provides some additional antialias filtering and it isolates the output buffer from the sampling glitches by providing a large charge reservoir from which to sample. In the exemplary implementation this capacitor is the only external component in the D-A converter. The filter has a small phase lag at the unity gain frequency of the loop. In this example the analog output 120 provides an analog feedback signal 270 which can be applied to one input of the integrator 1 stage shown in FIG. 6.

Figure 11B:
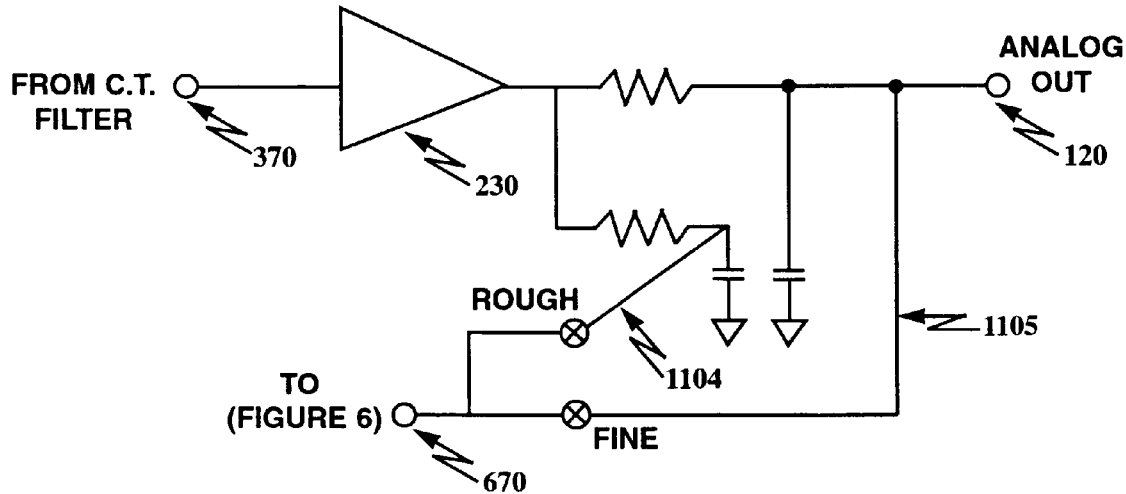

An alternative output structure is shown in Figure 11B. In this case, a rough precharge and fine feedback signal is provided. The rough charge path 1104 permits rapid charging of the feedback capacitor $C_{fb}$ with the fine adjustments occurring via path 1105. This two path arrangement reduces the disturbance of the analog output 120 by the sampling process. The feedback line 670, in this case, is applied to junction A of FIG. 6.

Figure 11C:
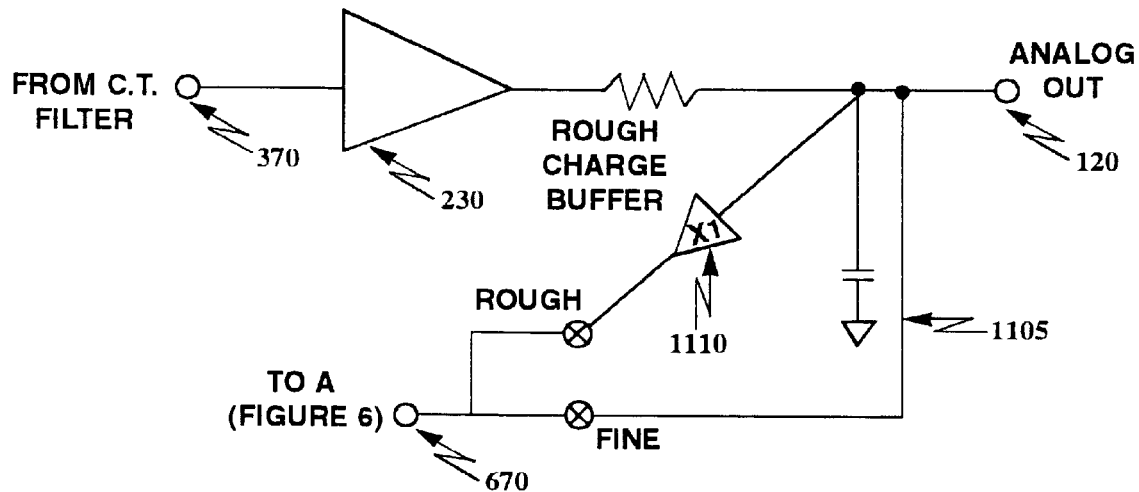

FIG. 11C utilizes a variation of the rough/fine approach. Here an active rough charge buffer 1110 provides the precharging of $C_{fb}$ to minimize the disturbance of the output for sampling.

Figure 11D:
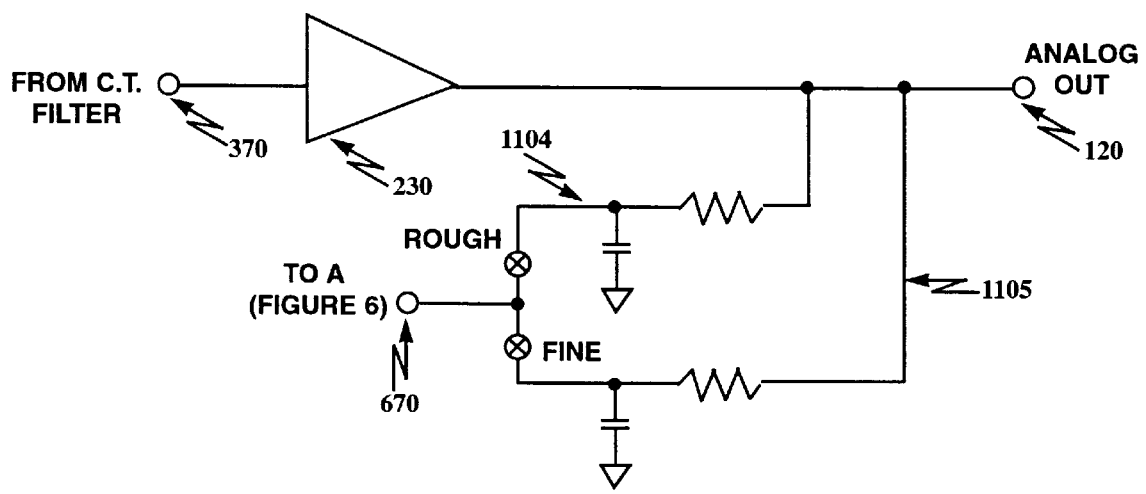

The buffer/resampling arrangement in FIG. 11D mimics very accurately the arrangement found in a high linearity A-D converter. Should the accuracy requirements be sufficiently small, the rough path 1104 may be not be necessary. The function and the elements involved are identical to those shown in FIG. 11B. It is assumed that the voltage drop across the fine resistor is negligible or at least linear. Thus the output voltage 120 can be taken from the output of the buffer directly. The advantage is that for such a loop, additional external amplifiers or actuators could be integrated following the on-chip buffer and feedback could be provided through attenuators or sensors.

Figure 12:
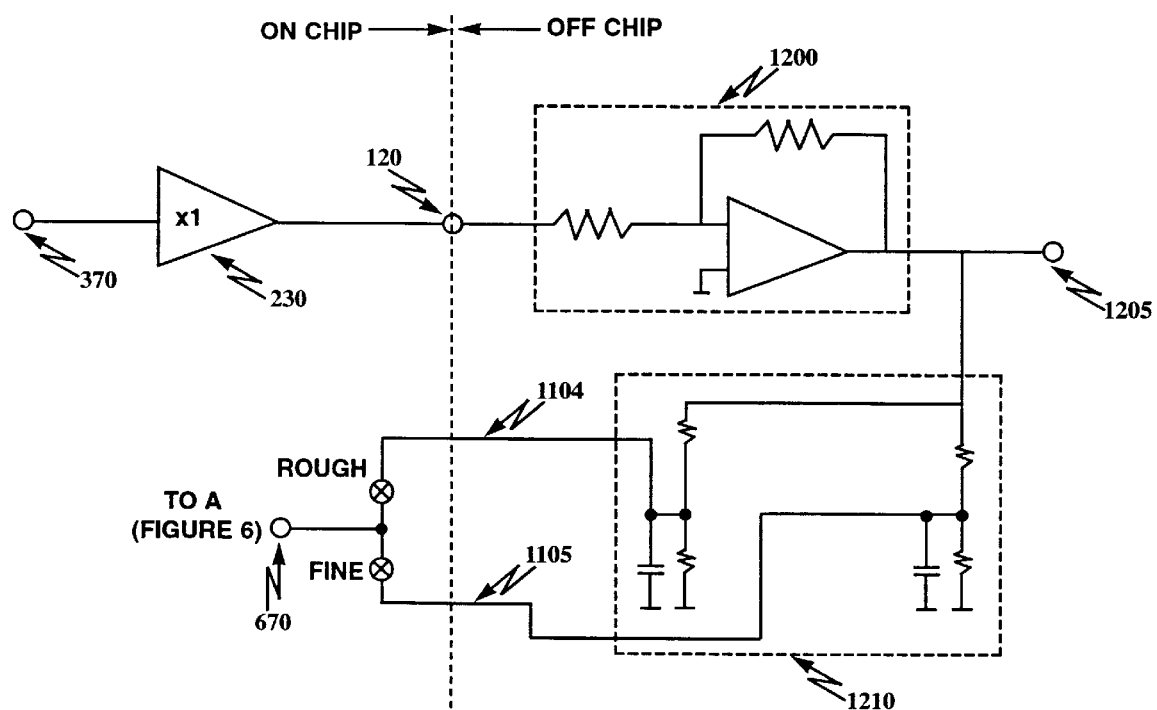
FIG. 12 is a schematic diagram of an application example of a buffer and resample circuit.

FIG. 12 shows an application example. Block 1200 represents an external amplifier or transducer stage. For example, if an output signal with a voltage level larger than the supply voltage of the IC was desired, an external gain stage could amplify the signal from the chip to the desired level. The final output is at 1205 and should be linear. A sensing unit 1210 that provides an electrical signal of suitable size and a charge reservoir from which to sample is used. For example a resistive divider with antialias filtering could attenuate the voltage to allow sampling on the chip. As long as the gain and phase of the system at unity gain cross over do not change significantly, this addition will not affect loop stability. Linearity and noise requirements for the amplifier in 1200 are relaxed; only the feedback path through the attenuator must be linear. Many other applications can take advantage of the integration of off-chip circuitry into the loop for relaxed linearity and noise requirements: Power amplification with high output current demands, where linear feedback can be achieved though a suitable resistive divider. Or an application where it is desired to produce a precise digitally controlled non-electrical signal such as for example pressure at output 1205. Here a pressure transducer with relaxed noise and distortion requirements is used as block 1200. Pressure feedback representing block 1210 is provided through a linear transducer that produces an electrical output that will be antialias filtered and sampled to close the feedback loop.

The architecture described thus far uses loop gain to overcome non-linearity in all but the first stage integrator and the sampling circuitry as all other typical distortion mechanisms are included in the feedback loop. Integrator 1 essentially defines the performance, thereby permitting relaxed noise and distortion specifications for the following stages. As a result one can use a buffer of 60 dB signal to noise plus distortion, a switched capacitor circuit of 80 dB signal to noise plus distortion and still perform digital to analog conversion with 120 dB signal to noise plus distortion. Using the inventive techniques, therefore, one can relax design specifications for individual components in the DAC and yet archive high performance DAC operation. In the architecture shown one may expect to achieve an output voltage of 5 Vpp, a signal to noise ratio of 114 dB over the band from 0 or 400 Hz, a linearity of 120 dB and an output current of greater than 1 mA, all with a power of less than 14 mW.

Figure 13:
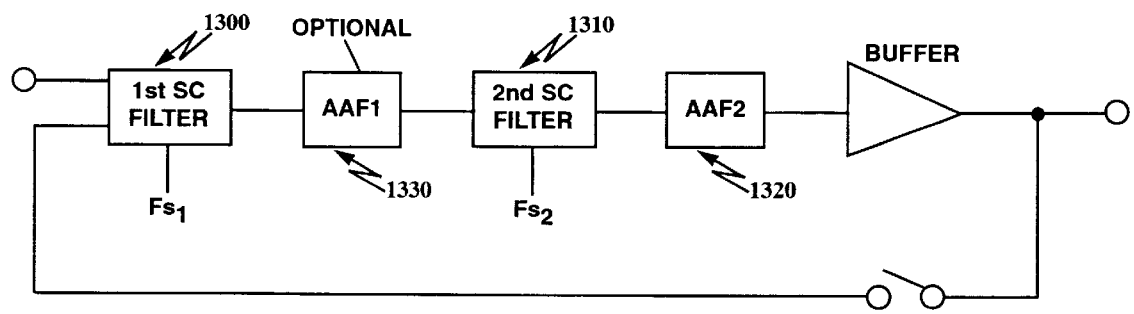
FIG. 13 is a block diagram of an alternative approach to that shown in FIG. 2 which results in relaxed filter requirements.

FIG. 13 is block diagram of an alternative approach to that shown in FIG. 2 which results in relaxed continuous time filter requirements. In the approach illustrated, the sampling frequency for integrator 1 Fs1 is different from that of the last switched capacitor stage Fs2. Using two different sampling frequencies for the two switched capacitor blocks 1300 and 1310 reduces the antialias filtering requirements inside the loop. The glitch energy from the switched capacitors is located around n*Fs2. The sampling process of integrator 1 aliases down frequency components around n*Fs1. In a typical switched capacitor system fs1=fs2 or fs1=2*fs2. As a result, sampling aliases down unwanted glitch energy at fs1. An antialiasing filter will have to reduce these artifacts sufficiently at fs1. If a switched capacitor system is utilized with two frequencies fs1=fx/I and fs2=fx/j, where i and j do not have any dividers in common, the lowest frequency at which aliasing of glitch energy occurs is fx, which is much larger than fs1. Therefore, the antialias filter requirement is easier to meet since the distance between the signal band and the stop band for the filter is increased. The order of the antialias filter AAF2 1320 may be reduced, or its phase lag at unity gain crossover be less, such that other performance parameters can be optimized. The interface between the two switched capacitor blocks can utilize another simple antialias filter AAF1 1330.

Although much of the discussion above has focused on the one bit D-A converter 150 shown in FIG. 1, one application of the circuit shown is in generating test signals. As discussed above, the source of digital information 100 in FIG. 1 can be a computer generated wave form. This waveform can be processed by the digital to analog converter 110 resulting in the very linear analog output 120 discussed above. This output can be applied in a variety of connections to test performance of a data acquisition channel or a sensor. A high linearity signal applied to a circuit or sensor with linearity problems will appear as distorted waveform. A system test can expose defective or improperly placed sensors or defective electronics in the field. The need to test both electronics alone and to excite a sensor requires an output multiplexing scheme.

Figure 14:
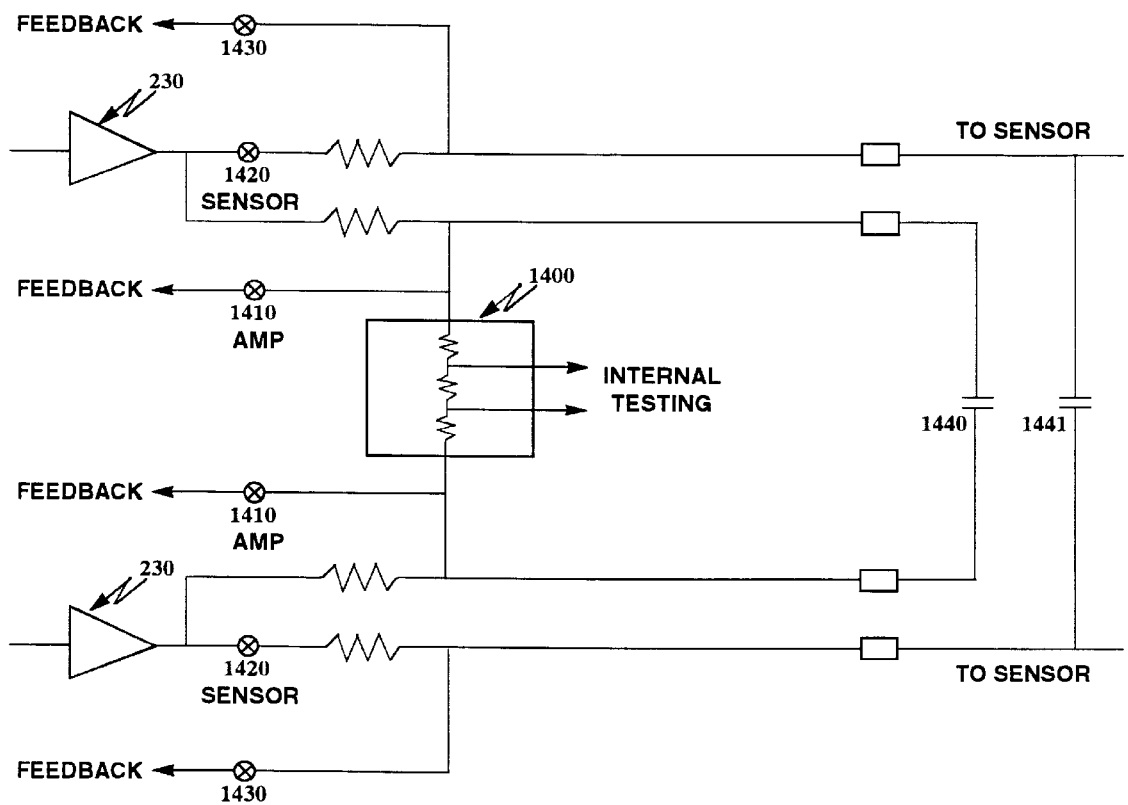
FIG. 14 is a schematic diagram of an output structure suitable for all of the tests described.

FIG. 14 is a schematic diagram of an exemplary implementation of an output structure suitable for all the above tests. The structure consists of two output buffers for the two differential outputs. The buffered outputs are applied to a differential attenuation circuit, which allows testing with low level signals with high signal to noise ratio. The attenuation is programmable via a tapped resistor string 1400. During this operation the output is sampled through the switches 1410 labeled AMP. A second method to close the feedback path is present through the switches labeled SENSOR. Switch 1420 directs the signal to a different set of output pins. The resampling now has to happen from a different output and thus a second set of switches 1430 directs the output to integrator 1. The nonlinear resistance of the switches will not affect the signal. Switch 1420 is preceded by large loop gain. Switch 1430 is in the sampled data path, where nonlinear switch impedances have only minor effects. Antialias filter capacitors have to be provided on both possible outputs as shown with capacitors 1440 and 1441.

Figure 15:
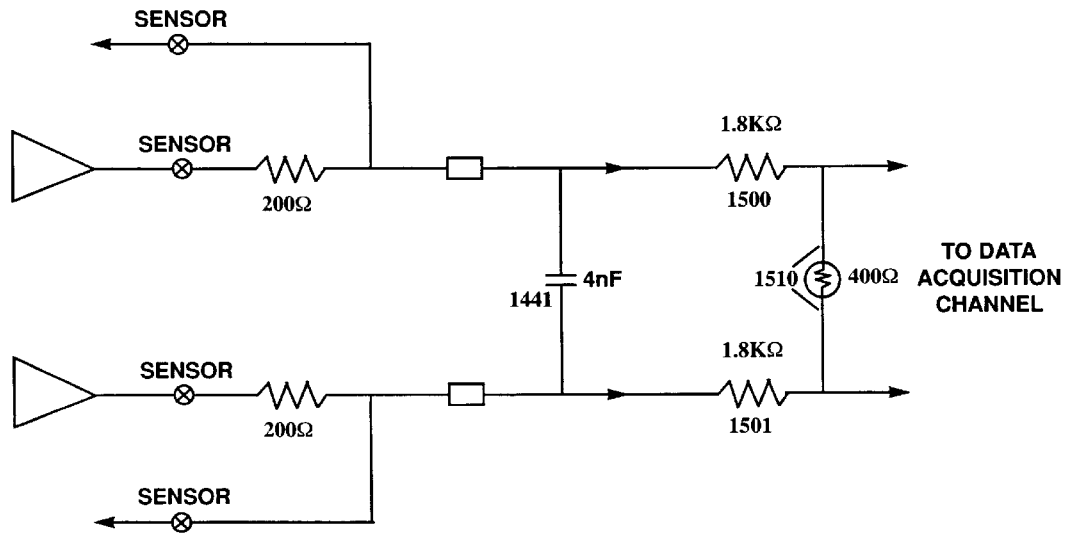
FIG. 15 is a schematic diagram of the output structure of FIG. 14 converted for a test of a moving coil seismic sensor, such as a geophone.

FIG. 15 shows the given output structure connected for a test of a moving coil seismic sensor, such as a geophone. The switches labeled SENSOR are closed and the switches labeled AMP are open. The open switches are not shown for clarity. The high precision signal is present at the output. Typical values for a geophone connection are shown. The resistors 1500 and 1501 provide a voltage division. It will appear linear if the sensor is working properly. The signal at the geophone terminals 1510 is digitized by the acquisition channel to determine its distortion and thus the integrity of the sensor and its proper placement.

Figure 16:
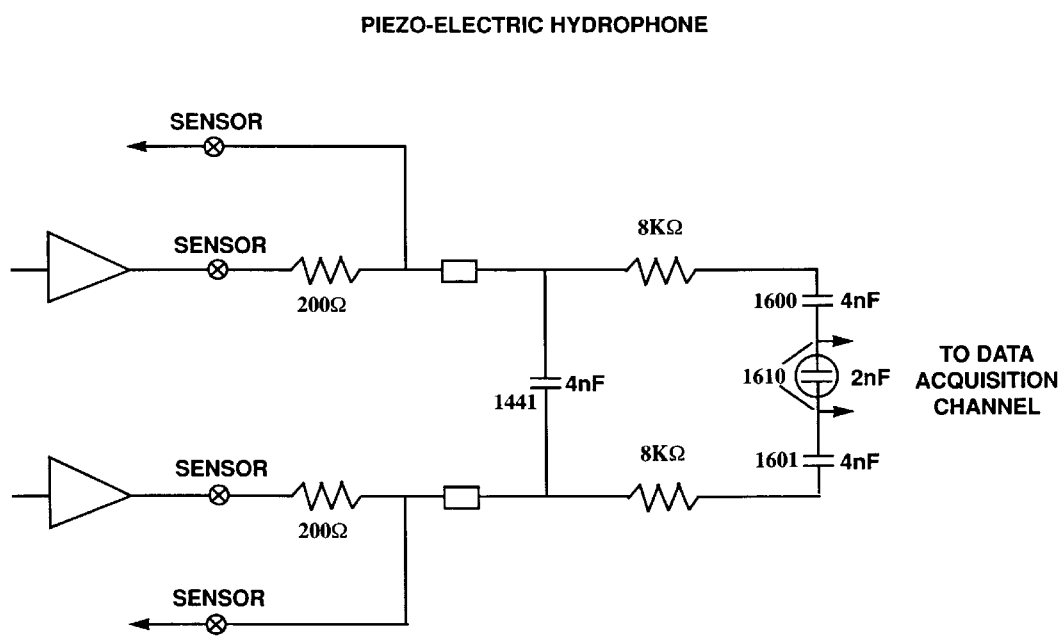
FIG. 16 is a schematic diagram of the output structure of FIG. 14 converted for a test of a piezoelectric sensor.

FIG. 16 shows the output structure connected for a the test of a piezoelectric seismic sensor, such as a hydrophone. The switches labeled SENSOR are closed and the switches labeled AMP are open. The open switches are not shown for clarity. The high precision signal is present at the output. Typical values for a hydrophone connection are shown. The capacitors 1600 and 1601 provide a voltage division. It will appear linear if the sensor is working properly. The signal at the hydrophone terminals 1610 is digitized by the acquisition channel to determine its distortion and thus the integrity of the sensor.

Although the present invention has been described and illustrated in detail, it is clearly understood that the same is by way of illustration and example only and is not to be taken by way of limitation, the spirit and scope of the present invention being limited only by the terms of the appended claims and their equivalents.

What is claimed is:

1. A multibit digital to analog converter, comprising:
   a. a subtraction circuit for receiving a charge representing a multibit digital signal and a feedback signal;
   b. a signal processor for converting the output of said subtraction circuit into an analog signal; and
   c. a sampling circuit for sampling said analog signal to provide said feedback signal.

2. The multibit digital to analog converter of claim 1 in which said signal processor comprises a discrete time processor.

3. The multibit digital to analog converter of claim 2 in which said discrete time processor comprises an integrator chain.

4. The multibit digital to analog converter of claim 3 in which said integrator chain comprises a first integrator having an operational amplifier with an integration capacitor connected from output to one input of two inputs to said operational amplifier.

5. The multibit digital to analog converter of claim 4 in which said subtraction circuit comprises two switched capacitor circuits each connected at one end to said one input to said operational amplifier.

6. The multibit digital to analog converter of claim 3 in which the output of the integrators of said integrator chain are summed and connected to a low pass filter.

7. The multibit digital to analog converter of claim 6 in which said low pass filter is a second order Butterworth filter.

8. The multibit digital to analog converter of claim 2 in which said signal processor comprises a continuous time processor.

9. The multibit digital to analog converter of claim 8 in which said continuous time processor comprises a continuous time low pass smoothing filter.

10. The multibit digital to analog converter of claim 8 in which said continuous time processor comprises a second order $g_m C$ filter.

11. The multibit digital to analog converter of claim 1 in which a finite impulse response filter is connected between said digital signal and said subtraction circuit.

12. The one bit digital to analog converter of claim 11 in which said finite impulse response filter is an analog finite impulse filter.

13. The one bit digital to analog converter of claim 11 in which said finite impulse response filter is a time multiplexed analog finite impulse filter.

14. The multibit digital to analog converter of claim 1 in which a buffer is connected between the output of said signal processor and said sampling circuit.

15. The multibit digital to analog converter of claim 1 in which said sampling circuit comprises a switch between said analog output and said subtraction circuit.

16. The multibit digital to analog converter of claim 1 in which said sampling circuit comprises two paths from said analog output to said subtraction circuit.

17. The multibit digital to analog converter of claim 16 in which one of said paths provides a rough charge of a capacitor of a switched capacitor input to said subtraction circuit and the other path provides a fine charge of said switched capacitor.

18. The multibit digital to analog converter of claim 1 in which said one of said paths comprises a rough charge buffer.

19. A method of converting a multibit digital signal to an analog signal, comprising the step of:

combining feedback from an analog output across the discrete time/continuous time interface to an input receiving said multibit digital signal.

20. A method of converting a multibit digital signal to an analog signal, comprising the step of:

passing a multibit digital signal from an input through a finite impulse response filter to a signal processing stage providing feedback from said analog output to the input of said signal processing stage.

21. A system for signal processing comprising:

a. a source of multibit digital signals;

b. a multibit digital to analog converter receiving said multibit digital signals and converting them to an analog signal; and c. a feedback circuit providing feedback from said analog signal to at least one input of said digital to analog converter.

22. The system of claim 21 in which said digital to analog converter comprises at least one switched capacitor integrator.

23. The system of claim 21 in which said digital to analog converter comprises an amplifier followed by discrete time and continuous time filtering.

24. An integrated circuit, comprising:

a. an input for receiving multibit digital signals;

b. a multibit digital to analog converter receiving said multibit digital signals and converting them to an analog signal; and c. a feedback circuit providing feedback from said analog signal to at least one input of said digital to analog converter.

* * * * *